United States Patent [19]
Kobayashi

[11] Patent Number: 6,028,461
[45] Date of Patent: Feb. 22, 2000

[54] CLOCK ADJUSTING CIRCUIT AND METHOD TO ADJUST A DELAY VALUE OF A CLOCK INPUT SIGNAL

[75] Inventor: Naoki Kobayashi, Tokyo, Japan

[73] Assignee: NEC Corporation, Tokyo, Japan

[21] Appl. No.: 09/105,136

[22] Filed: Jun. 26, 1998

[30] Foreign Application Priority Data

Jun. 30, 1997 [JP] Japan ................................ 9-174141

[51] Int. Cl.[7] ...................................................... H03L 7/06
[52] U.S. Cl. ............................ 327/155; 327/160; 327/161
[58] Field of Search ...................................... 327/141, 144,
327/146, 151, 153, 155, 160, 161, 162,
165, 166, 172, 173, 174, 175, 176

[56] References Cited

U.S. PATENT DOCUMENTS

| | | | |
|---|---|---|---|
| 5,142,555 | 8/1992 | Whiteside | 375/81 |
| 5,646,564 | 7/1997 | Erickson et al. | 327/158 |
| 5,675,273 | 10/1997 | Masleid | 327/156 |
| 5,757,218 | 5/1998 | Blum | 327/175 |
| 5,811,998 | 9/1998 | Lundberg et al. | 327/156 |

FOREIGN PATENT DOCUMENTS

| | | |
|---|---|---|
| 0 762 262 A1 | 12/1997 | European Pat. Off. . |
| 60-224344 | 11/1985 | Japan . |
| 2-213412 | 8/1990 | Japan . |
| 2-255908 | 10/1990 | Japan . |
| 5-100768 | 4/1993 | Japan . |
| 6-61807 | 3/1994 | Japan . |
| 7-121932 | 5/1995 | Japan . |
| 7-152454 | 6/1995 | Japan . |
| 7-248847 | 9/1995 | Japan . |

*Primary Examiner*—Jeffrey Zweizig
*Attorney, Agent, or Firm*—McGinn & Gibb, P.C.

[57] ABSTRACT

A clock adjusting circuit is disclosed which is able to adjust automatically both the phase and pulse width of a balanced transmission clock, to be coincident with the reference clock. Phase comparison circuits 13, 14 detect the difference between the phase of a reference clock (REF) and a feedback signal of the clock output. Counters 15, 16 count based on the difference detected by the phase comparison circuits 13, 14, respectively. Delay circuits 11, 12 delay the clock input signals based on the counted value by the counters 15, 16. Clock output signal is obtained after selecting, by the selector 23, the result of OR or AND of the outputs of the delay circuit 11, 12.

9 Claims, 5 Drawing Sheets

[6,028,461]

CLOCK ADJUSTING CIRCUIT AND METHOD TO ADJUST A DELAY VALUE OF A CLOCK INPUT SIGNAL

BACKGROUND OF THE INVENTION

1. Field of the Invention

The present invention relates to a clock adjusting circuit which adjusts the phase and pulse width of the clock.

This application is based on patent application No.Hei 09-174141 filed in Japan, the content of which is incorporated herein by reference.

2. Description of Related Art

Clock width adjusting has been conventionally handled manually by the user. As an example, a patent with an publication number of Hei 09-152454 shows a case in which the 2 types of clock with different phases and same period are generated. The pulse width of above 2 types of clock are adjusted by manual control of the phase difference. Also, FIG. 5 shows an another example of a circuit which adjusts the pulse width by manually controlling the delay at the delay circuit 32, containing a half dividing circuit 31, delay circuit 32, and exclusive OR circuit (EXOR) 33.

There is a problem in the above conventional cases that when adjusting the pulse width, a user needs to operate the switch, delay line, variable resistance, and operating terminal while observing the waveform on the measuring instrument. Also, there is an another problem that it is generally difficult to adjust the phase of the clock.

SUMMARY OF THE INVENTION

It is therefore an object of the present invention to provide a dock adjusting circuit which is capable to of automatically adjusting so that both the phase and the pulse width of the clock of balanced transmission conform to a reference clock.

In order to attain this object, the present invention provides a clock adjusting circuit for attaining a clock output signal conforming to a reference clock signal by delaying a clock input signal based on the difference between the feedback of the clock output signal and the reference clock signal.

The present invention further provides a clock adjusting circuit comprising: decision circuit for the delay value of a clock output signal which decides the delay value by detecting the difference between the feedback of the clock output signal and the reference clock signal; and delay means which delays said clock input signal based on said delay value decided by said decision circuit for the delay value.

The present invention further provides a clock adjusting circuit wherein said decision circuit for the delay value further comprises: a phase comparison circuit with positive logic for detecting the differences between the phases of the feedback signal of said clock output with positive logic and the reference clock signal with positive logic; and a phase comparison circuit with negative logic for detecting the differences between the phases of the feedback signal of said clock output with negative logic and reference clock signal with negative logic.

The present invention further provides a clock adjusting circuit wherein said decision circuit for the delay value further comprises: a counter with positive logic wherein the clock value is increased when said feedback signal with positive logic is ahead of said reference clock signal with positive logic, the clock value is decreased when said feedback signal with positive logic is behind said reference clock signal with positive logic, and counting is ceased when the difference between the phases of said feedback signal with positive logic and said reference clock signal with positive logic is less than a predefined value and when the difference between the phases of said feedback signal with negative logic and said reference clock signal with negative logic is less than a predefined value; a counter with positive logic wherein the clock value is increased when said feedback signal with negative logic is ahead of said reference clock signal with negative logic, the clock value is decreased when said feedback signal with negative logic is behind said reference clock signal with negative logic, and counting is ceased when the difference between the phases of said feedback signal with negative logic and said reference clock signal with negative logic is less than a predefined value; and a counter selector wherein the counting value of said counter with negative logic is output until the difference between said feedback signal with negative logic and said reference clock signal with negative logic is not less than a predefined value, and counting value of said counter with positive logic is output until the difference between said feedback signal with negative logic and said reference clock signal with negative logic is less than a predefined value.

The present invention further provides a clock adjusting circuit wherein said delay means further comprises: a delay circuit with positive logic for delaying the clock input signal with positive logic based on the output of said counter selector; a delay circuit with negative logic for delaying the clock input signal with negative logic based on the output of said counter selector; and a clock generating means for generating the clock output with a combination of the outputs of said delay circuit with positive logic and of said delay circuit with negative logic.

The present invention further provides a clock adjusting circuit wherein said clock generating means further comprises: an AND circuit to generate an AND of output signal with positive logic of said delay circuit with positive logic and output signal with negative logic of said delay circuit with negative logic; an OR circuit to generate an OR of output signal with positive logic of said delay circuit with positive logic and output signal with negative logic of said delay circuit with negative logic; and a cock selector to select the output of said AND circuit when said feedback signal with positive logic is ahead of said reference clock signal with positive logic, and to select the output of said OR circuit when said feedback signal with positive logic is behind said reference clock signal with positive logic.

The present invention further provides a clock adjusting method comprising the steps of: delaying the clock input signal to match the leading edge of a feedback signal with negative logic of clock output to the leading edge of a reference clock signal with negative logic; and delaying the clock input signal to match the leading edge of a feedback signal with positive logic of clock output to the leading edge of a reference clock signal with positive logic.

With the clock adjusting circuit of the present invention, the required clock output conforming with the reference clock signal can be obtained by delaying a clock input signal based on the difference between the feedback of the clock output signal and the reference clock signal.

DESCRIPTION OF PREFERRED EMBODIMENTS

Figure 1:
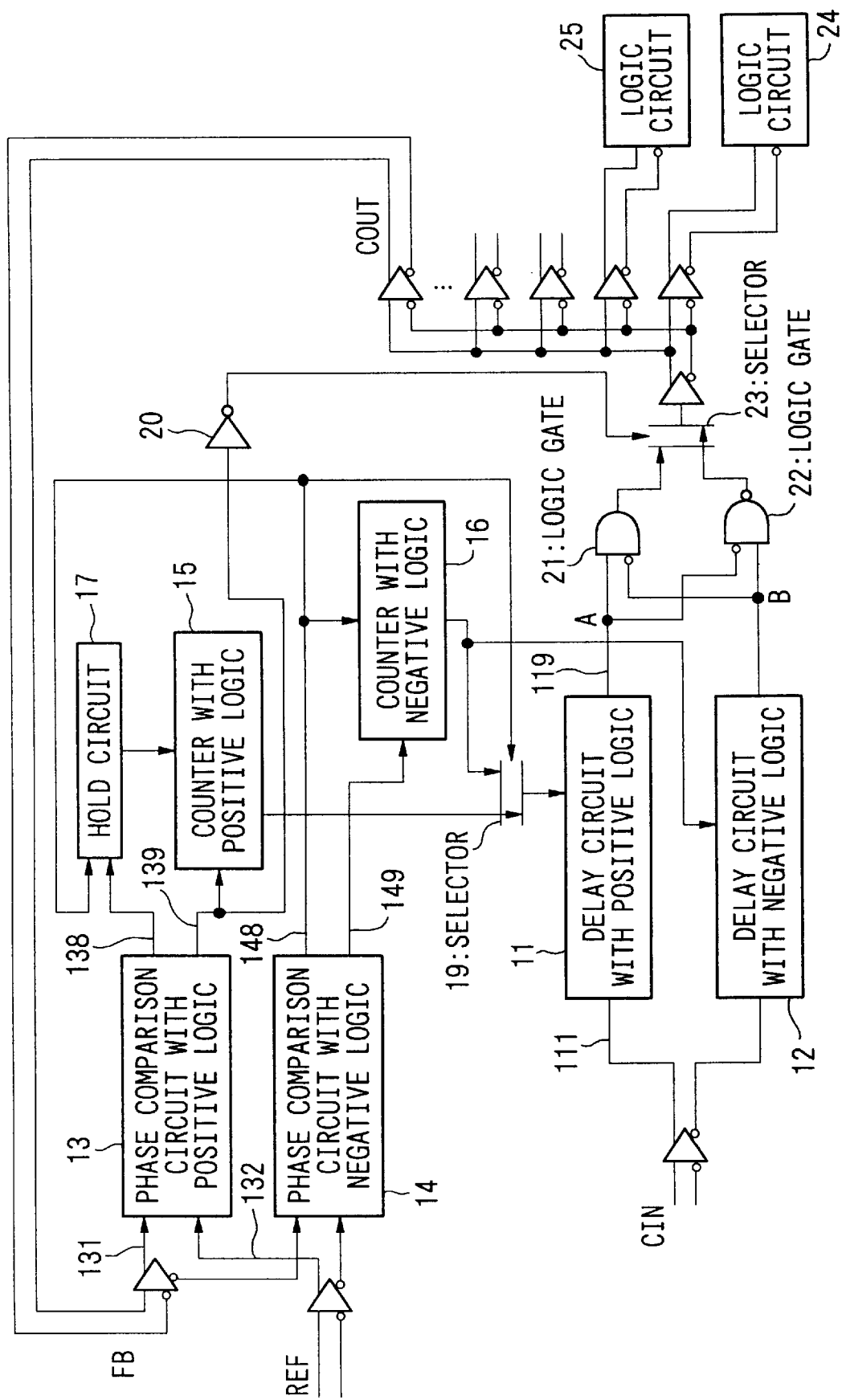
FIG. 1 is a block diagram illustrating the clock adjusting circuit according to an embodiment of the present invention.

Hereinbelow, a clock adjusting circuit according to an embodiment of the present invention will be described with reference to FIG. 1, which is a block diagram illustrating the clock adjusting circuit. In FIG. 1, a phase comparison circuit 13 with positive logic and a phase comparison circuit 14 with negative logic detect the difference between the phases of the reference clock signal (REF) and feedback signal (FB) of clock output. Counter 15 with positive logic and counter 16 with negative logic count the output of the above phase comparison circuit 13 with positive logic and phase comparison circuit 14 with negative logic, respectively. Hold circuit 17 stops the counting and holds the result of the counter 15 with positive logic when detecting that the difference between phase falls within a predefined range based on the output of both the phase comparison circuit 13 with positive logic and the phase comparison circuit 14 with negative logic.

Reference clock signal (REF) with positive logic and feedback signal (FB) with positive logic are both the input of phase comparison circuit 13 with positive logic. Using these input signals, phase comparison circuit 13 with positive logic detects the differences between the leading edges of the 2 input signals: the reference clock signal (REF) with positive logic and feedback signal (FB) with positive logic. On the other hand, reference clock signal (REF) with negative logic and feedback signal (FB) with negative logic are the inputs of the phase comparison circuit 14 with negative logic. Using these input signals, phase comparison circuit 14 with negative logic detects the difference between leading edges of the 2 input signals: reference clock signal (REF) with negative logic and feedback signal (FB) with negative logic.

Counter 15 with positive logic increases the count value when the phase of feedback signal (FB) with positive logic is ahead of the reference clock (REF) with positive logic, and decreases the count value when the phase of feedback signal (FB) with positive logic is behind the reference clock signal (REF) with positive logic, based on the comparison result of the phase comparison circuit 13 with positive logic. On the other hand, counter 16 with negative logic increases the count value when the phase of feedback signal (FB) with negative logic is ahead of the reference clock signal (REF) with negative logic, and decreases the count value when the phase of feedback signal (FB) with negative logic is behind the reference clock signal (REF) with negative logic, based on the comparison result of the phase comparison circuit 14 with negative logic.

Hold circuit 17 holds the count value of the counter 15 with positive logic when the differences between phases in both the phase comparison circuit 13 with positive logic and the phase comparison circuit 14 with negative logic are within the predefined range. This hold circuit 17 can be realized with AND gates.

The value of counter 16 with negative logic is fed to delay circuit 12 with negative logic. The clock input signal with negative logic is input to the delay circuit 12 with negative logic. The clock input signal with positive logic is input to delay circuit 11 with positive logic. Also, the value of either the counter 15 with positive logic or the counter 16 with negative logic is fed to the delay circuit 11 via selector 19, which has the two above signals for input.

The selector 19 selects the output of the counter 16 with negative logic when the difference between the phase for negative logic is outside of the predefined range, and the selector 19 selects the output of the counter 15 with positive logic when the difference between the phase for negative logic is within the predefined range.

Figure 2:
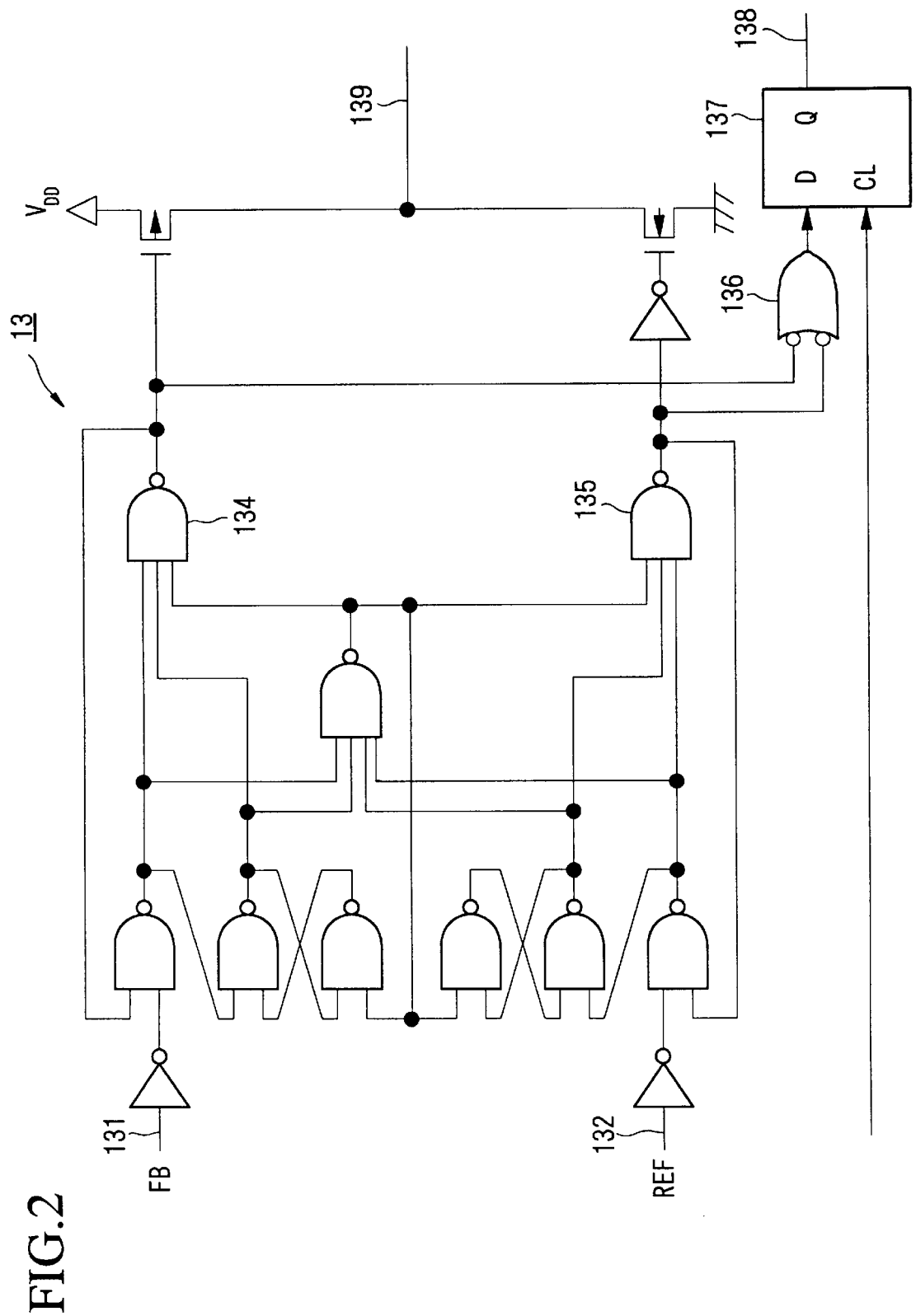
FIG. 2 is a diagram illustrating an example of the phase comparison circuit with positive logic in the present invention.

Referring to FIG. 2, which is a diagram of the phase comparison circuit 13 with positive logic of the present invention, input signals are the feedback signal (FB) 131 and the reference clock signal (REF) 132, and the output signals are the coincident signal 138 which indicates that the difference between both the above input signals is within the predefined range, and delay signal 139 which indicates that the above input signals are ahead or behind. Logic gate 134 returns "1" when the feedback signal 131 is behind the reference clock signal 132, and logic gate 135 returns "1" when the feedback signal 131 is ahead of the reference clock signal 132. By this operation, delay signal 139 returns "1" when feedback the signal 131 is ahead of the reference clock signal 132 and returns "0" when the feedback signal 131 is behind the reference clock signal 132.

Also, flip-flop 137 has a clock input which has a higher frequency than the reference clock signal (for example, 128 times). Logic gate 136 outputs the value "0" when the output of logic gates 134 and 135 are both "1". accordingly, the coincident signal 138 by flip-flop 137 returns "1" when the difference between the phases of the reference clock signal 132 and feedback signal 131 is within the predefined range.

The phase comparison circuit 14 with negative logic has the same construction as explained above with regard to the phase comparison circuit 13 with positive logic.

Figure 3:
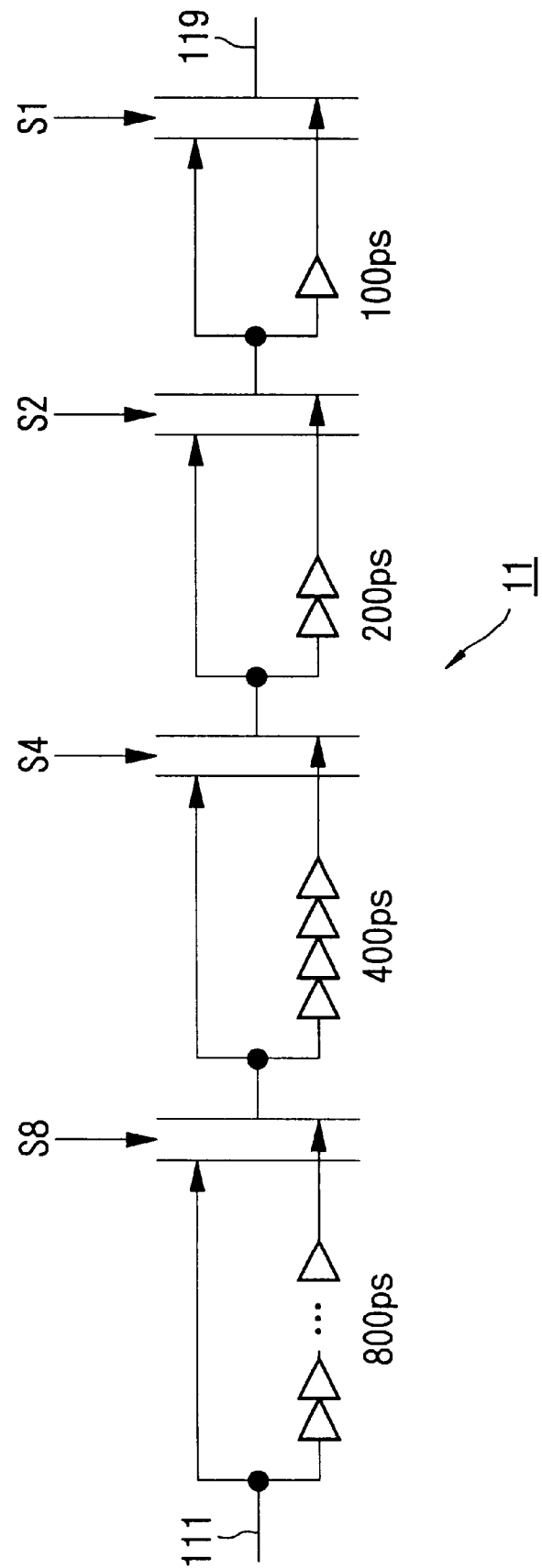
FIG. 3 is a block diagram illustrating an example of the delay circuit with positive logic in the present invention.

Referring to FIG. 3, which is a block diagram illustrating an example of the delay circuit with positive logic of the present invention, delay circuit 11 with positive logic is obtained by serially connected delay lines with different delay times via selectors, and is realized so that each delay line can be skipped according to the signals: S1, S2, S4, S8 from selector 19. The output of the selector 19 selected from counter 15 with positive logic or counter 16 with negative logic is added to clock input (CIN) 111, and the signal 119 is output. For example, a delay value in which every digit is weighted by signals from selector 19 with binary numeral is given, and total required delay value is obtained in the delay circuit 11 with positive logic.

The delay circuit 12 with negative logic has the same construction as explained above with regard to the delay circuit 11 with positive logic.

Referring to FIG. 1, logic gate 21 generates an AND operation result for the output of delay circuit 11 with positive logic and logically inverted output of delay circuit 12 with negative logic. Also, logic gate 22 generates an AND operation result with the logically inverted output of delay circuit 11 with positive logic and output of delay circuit 12 with negative logic. In other words, logic gate 21 works to narrow the pulse width of the clock with positive logic as the difference between the delay between in the delay circuit 11 with positive logic and in the delay circuit 12 with negative logic increases. Logic gate 22 works to widen the pulse width of the clock with positive logic as the difference between the same as mentioned above increases.

Selector 23 selects the output of logic gate 21 when the feedback signal (FB) is ahead of the reference clock signal (REF) based on the comparison at the phase comparison circuit 13 with positive logic, and selects the output of logic gate 22 when the feedback signal (FB) is behind the reference clock signal (REF) based on the comparison at the phase comparison circuit 13 with positive logic.

As explained above, selected signal at selector 23 is output as a clock output signal COUT and supplied to logic circuit 24, 25. It also is input to the phase comparison circuit 13, 14 as a feedback signal FB.

Next, actual operation of clock adjusting circuit of the present invention will be explained referring to the figures.

Figure 4:
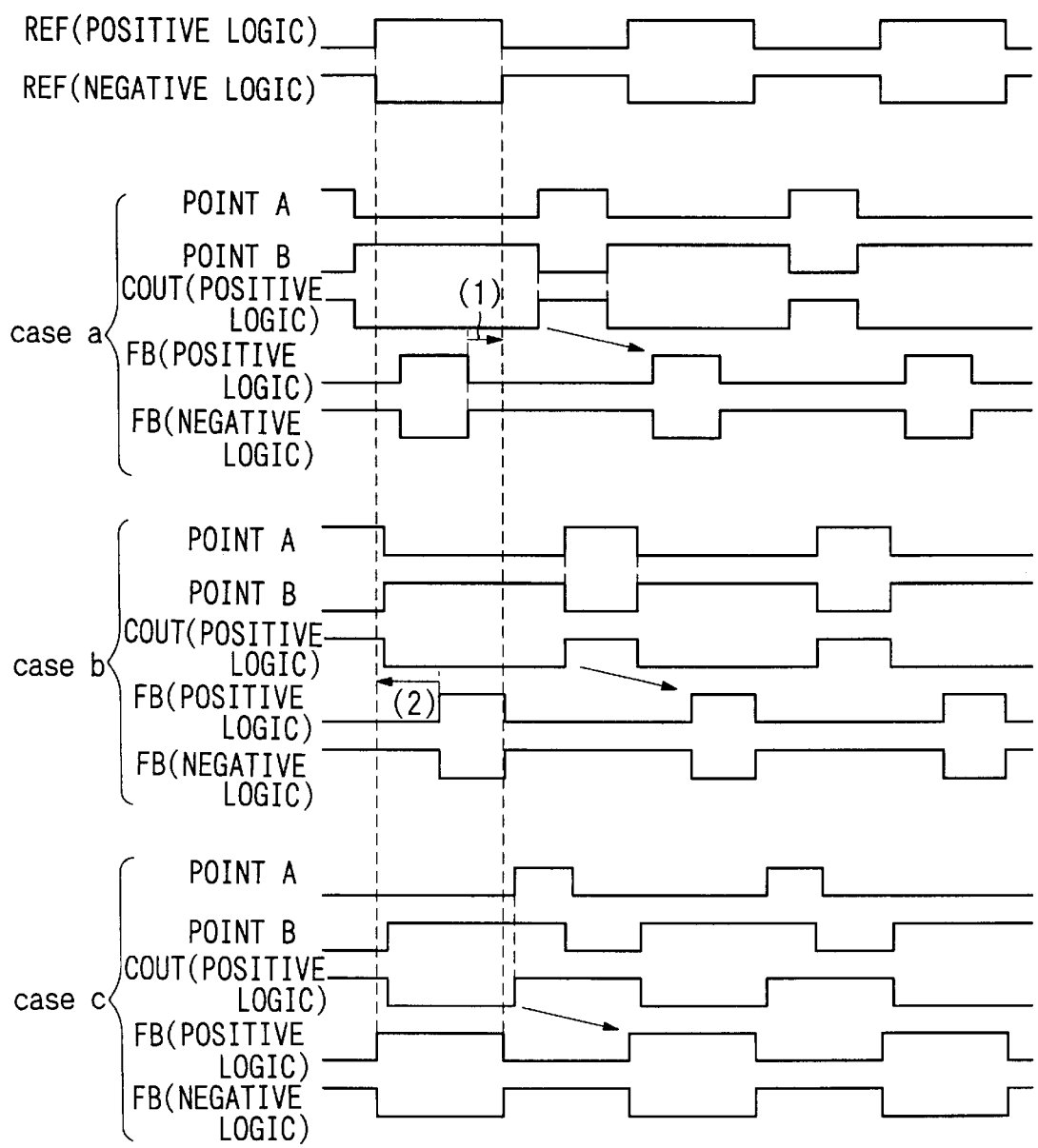
FIG. 4 is a timing chart explaining the operation of an embodiment of the present invention.
Figure 5:
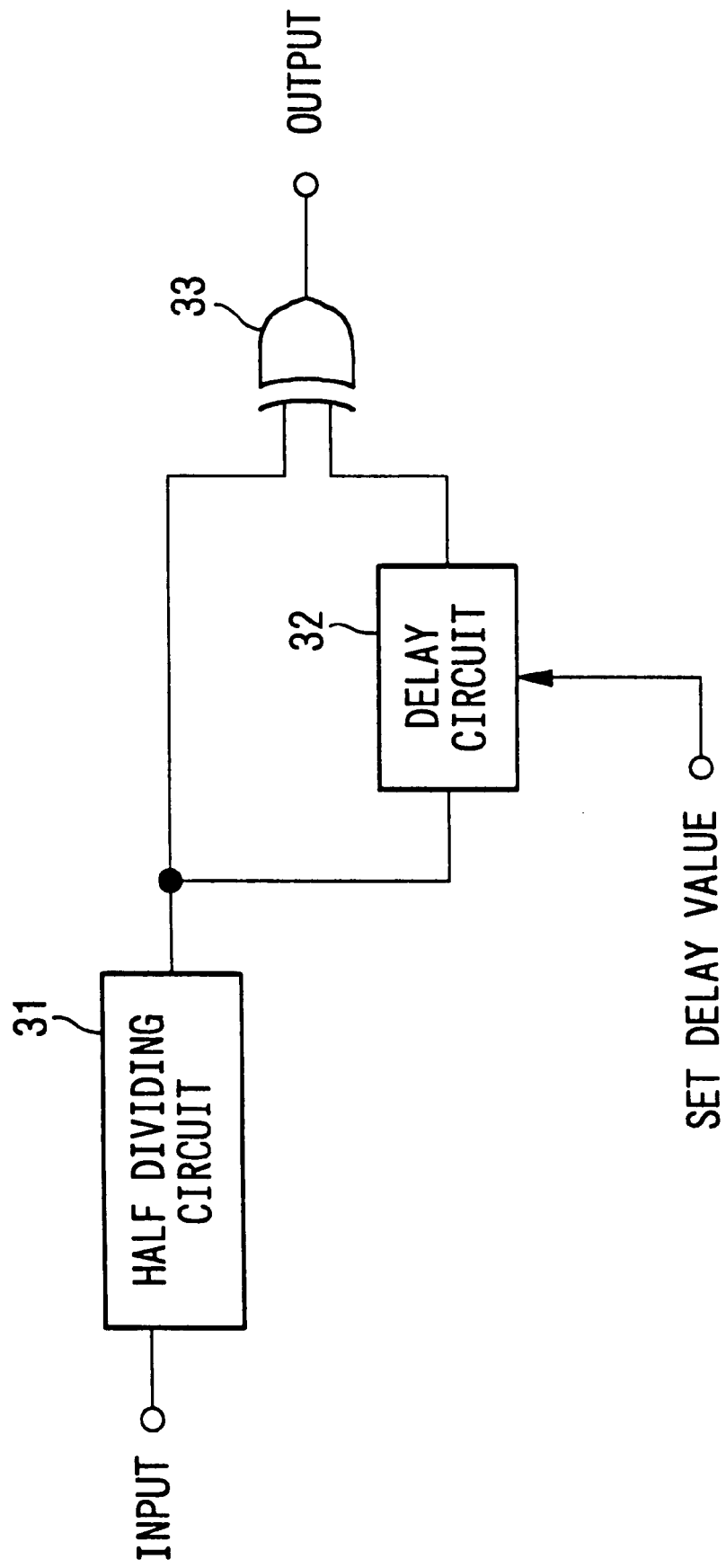
FIG. 5 is an example of a conventional clock adjusting circuit.

Referring to FIG. 1 and FIG. 4, when a feedback signal with a narrower pulse width than the reference clock signal's (REF) with positive logic is given, first, the timing of leading edge of feedback signal (FB) with negative logic is adjusted, as shown 'case a' in FIG. 4. Next, the timing of the leading edge of feedback signal (FB) with positive logic is adjusted, as shown 'case b' in FIG. 4. Finally, the required clock output can be obtained, as shown 'case c' in FIG. 4.

In 'case a' in FIG. 4, phase comparison circuit 13 with positive logic outputs "0" because the feedback signal (FB) with positive logic is behind the reference signal (REF) with positive logic, and phase comparison circuit 14 with negative logic outputs "1" because the feedback signal (FB) with negative logic is ahead of the reference signal (REF) with negative logic. Using this result, counter 15 with positive logic decreases the count value, and counter 16 with negative logic increases the count value.

As the coincident signal of the phase comparison circuit 14 with negative logic shows "not coincident" at the beginning, the selector 19 selects the output of counter 16 with negative logic. According to this, outputs of delay circuit 11, 12 increase the delay, and the phase at points A, B are gradually delayed. This is shown as (1) of feedback signal (FB) in 'case a' in FIG. 4.

When the phase comparison circuit 14 with negative logic detects that the phase is coincident as shown in 'case b' in FIG. 4, it outputs "1" as a coincident signal, stops the counting of the counter 16 with negative logic and holds the value. And, the selector 19 selects the output of the counter 15 with positive logic. As the counter 15 with positive logic had decreased the count value up to that point, the delay value of the delay circuit 11 with positive logic decreases and the phase at point A advances.

At this time, an inverter 20 outputs "1" because the delay signal of phase comparison circuit with positive logic 13 is "0". Accordingly, the selector 23 selects the output of the logic gate 22. Because of this, the pulse width of clock output signal COUT with positive logic narrows as the phase at point A advances. This is shown at (2) of feedback signal (FB) of 'case b' in FIG. 4.

The hold circuit 17 stops the counting of the counter 15 with positive logic and holds the value, when the phases are as 'case c' and that coincident signals of both the phase comparison circuit 14 with negative logic and of the phase comparison circuit 13 with positive logic as shown to be "coincident". By these operations, the waveform of the clock output signal COUT is adjusted as required.

As explained above, an embodiment of the present invention has an the operations of detecting the phase differences between the reference clock (REF) and the feedback signal (FB) by comparing them at the comparison circuit 13, 14, and counting the result using the counter 15, 16. According to this counting value, clock input is delayed by the delay circuits 11, 12, and the required clock output is obtained, which is indicated by the reference clock (REF).

What is claimed is:

1. A clock adjusting circuit comprising:
    a decision circuit that decides a delay value of a clock input signal with positive logic and a clock input signal with negative logic;
    a delay circuit that delays said clock input signal based on said delay value decided by said decision circuit, said decision circuit comprising:
        a phase comparison circuit with positive logic for detecting differences between phases of a feedback signal of a clock output signal with positive logic and a reference clock signal with positive logic; and
        a phase comparison circuit with negative logic for detecting differences between phases of a feedback signal of a clock output signal with negative logic and a reference clock signal with negative logic, wherein said decision circuit decides the delay value at least based on said detected differences of said phase comparison circuit with positive logic and said detected differences of said phase comparison circuit with negative logic.

2. A clock adjusting circuit according to claim 1, wherein said decision circuit further comprises:
    a first counter with positive logic having a first count value, wherein the first count value is increased when said feedback signal with positive logic is ahead of said reference clock signal with positive logic, the first count value is decreased when said feedback signal with positive logic is behind said reference clock signal with positive logic, and counting is ceased when the difference between the phases of said feedback signal with positive logic and said reference clock signal with positive logic is less than a first predefined value;
    a second counter with negative logic having a second count value, wherein the second count value is increased when said feedback signal with negative logic is ahead of said reference clock signal with negative logic, the second clock value is decreased when said feedback signal with negative logic is behind said reference clock signal with negative logic, and counting is ceased when the difference between the phases of said feedback signal with negative logic and said reference clock signal with negative logic is less than a second predefined value; and
    a counter selector wherein the second count value of said second counter with negative logic is output as an output signal until the difference between said feedback signal with negative logic and said reference clock signal with negative logic is not less than the second predefined value, and the first count value of said first counter with positive logic is output as the output signal until the difference between said feedback signal with negative logic and said reference clock signed with negative logic is less than the second predefined value.

3. A clock adjusting circuit according to claim 2, wherein said delay circuit comprises:
    a first delay circuit with positive logic for delaying the clock input signal with positive logic based on the output signal of said counter selector, said first delay circuit outputting a first output signal;
    a second delay circuit with negative logic for delaying the clock input signal with negative logic based on the output signal of said counter selector, said second delay circuit outputting a second output signal; and
    a clock generating means for generating the clock output with a combination of the first output signal of said first delay circuit with positive logic and of said second output signal of said second delay circuit with negative logic.

4. A clock adjusting circuit according to claim 3, wherein said clock generating means comprises:

an AND circuit to generate a logical AND operation of the first output signal of said first delay circuit with positive logic and the second output signal of said second delay circuit with negative logic;

an OR circuit to generate a logical OR operation of the output signal with positive logic of said delay circuit with positive logic and the output signal of said second delay circuit with negative logic; and a clock selector to select an output of said AND circuit when said feedback signal with positive logic is ahead of said reference clock signal with positive logic, and to select an output of said OR circuit when said feedback signal with positive logic is behind said reference clock signal with positive logic.

5. A clock adjusting method comprising:

receiving a reference clock signal with positive logic and a reference clock signal with negative logic;

detecting a leading edge of a feedback signal with negative logic and a leading edge of the reference clock signal with negative logic;

detecting a leading edge of a feedback signal with positive logic and a leading edge of the reference clock signal with positive logic;

delaying a clock input signal with negative logic to match the leading edge of the feedback signal with negative logic to the leading edge of the reference clock signal with negative logic; and delaying a clock input signal with positive logic to match the leading edge of the feedback signal with positive logic to the leading edge of the reference clock signal with positive logic.

6. A clock adjusting circuit comprising:

a decision circuit that delays a clock input signal with positive logic and delays a clock input signal with negative logic, said decision circuit comprising:

a phase comparison circuit with positive logic for detecting differences between a feedback signal of a clock output signal with positive logic and a reference clock signal with positive logic; and a phase comparison circuit with negative logic for detecting differences between a feedback signal of a clock output signal with negative logic and a reference clock signal with negative logic, wherein said decision circuit decides a delay value at least based on said detected differences of said phase comparison circuit with positive logic and said detected differences of said phase comparison circuit with negative logic.

7. A clock adjusting circuit according to claim 6, wherein said decision circuit further comprises:

a first counter with positive logic having a first count value, wherein the first count value is increased when said feedback signal with positive logic is ahead of said reference clock signal with positive logic, the first count value is decreased when said feedback signal with positive logic is behind said reference clock signal with positive logic, and counting is ceased when the difference between the phases of said feedback signal with positive logic and said reference clock signal with positive logic is less than a first predefined value;

a second counter with negative logic having a second count value, wherein the second count value is increased when said feedback signal with negative logic is ahead of said reference clock signal with negative logic, the second clock value is decreased when said feedback signal with negative logic is behind said reference clock signal with negative logic, and counting is ceased when the difference between the phases of said feedback signal with negative logic and said reference clock signal with negative logic is less than a second predefined value; and a counter selector wherein the second count value of said second counter with negative logic is output as an output signal until the difference between said feedback signal with negative logic and said reference clock signal with negative logic is not less than the second predefined value, and the count value of said first counter with positive logic is output as the output signal until the difference between said feedback signal with negative logic and said reference clock signal with negative logic is less than the second predefined value.

8. A clock adjusting circuit according to claim 7, wherein said decision circuit comprises:

a first delay circuit with positive logic for delaying the clock input signal with positive logic based on the output signal of said counter selector, said first delay circuit outputting a first output signal;

a second delay circuit with negative logic for delaying the clock input signal with negative logic based on the output signal of said counter selector, said second delay circuit outputting a second output signal; and a clock generating circuit that generates the clock output signal with a combination of the first output signal of said first delay circuit with positive logic and of said second output signal of said second delay circuit with negative logic.

9. A clock adjusting circuit according to claim 8, wherein said clock generating circuit comprises:

an AND circuit to generate a logical AND operation of the first output signal of said first delay circuit with positive logic and the second output signal of said second delay circuit with negative logic;

an OR circuit to generate a logical OR operation of the output signal with positive logic of said delay circuit with positive logic and the output signal of said second delay circuit with negative logic; and a clock selector to select the output of said AND circuit when said feedback signal with positive logic is ahead of said reference clock signal with positive logic, and to select the output of said OR circuit when said feedback signal with positive logic is behind said reference clock signal with positive logic.

* * * * *